United States Patent
Blednov

(10) Patent No.: US 7,800,448 B2
(45) Date of Patent: Sep. 21, 2010

(54) DOHERTY AMPLIFIER

(75) Inventor: Igor Blednov, Nijmegen (NL)

(73) Assignee: NXP B.V., Eindhoven (NL)

( * ) Notice: Subject to any disclaimer, the term of this patent is extended or adjusted under 35 U.S.C. 154(b) by 79 days.

(21) Appl. No.: 12/297,036

(22) PCT Filed: Apr. 11, 2007

(86) PCT No.: PCT/IB2007/051305
§ 371 (c)(1),
(2), (4) Date: Oct. 13, 2008

(87) PCT Pub. No.: WO2007/119208
PCT Pub. Date: Oct. 25, 2007

(65) Prior Publication Data
US 2009/0179702 A1    Jul. 16, 2009

(30) Foreign Application Priority Data
Apr. 14, 2006 (EP) .................................. 06112675

(51) Int. Cl.
*H03F 3/68* (2006.01)
(52) U.S. Cl. .................... 330/295; 330/124 R; 330/302
(58) Field of Classification Search .................. 330/295, 330/124 R, 302
See application file for complete search history.

(56) References Cited
U.S. PATENT DOCUMENTS
5,420,541 A * 5/1995 Upton et al. ................. 330/286

(Continued)

FOREIGN PATENT DOCUMENTS
EP    0630104 A2    12/1994
WO    2004017512 A1    2/2004

OTHER PUBLICATIONS

Doherty W H; "A New High-Efficiency Power Amplifier for Modulated Waves". Bell Telephone Sysem Technical Publications, Annual Convention of the Institute of Radio Engineers, Cleveland, OH, May 1936.

(Continued)

*Primary Examiner*—Patricia Nguyen

(57) ABSTRACT

An integrated Doherty amplifier structure comprises an input bond pad (IBP), and an output bond pad (OBP). A first transistor (T1) forms the peak amplifier stage of the Doherty amplifier and has a control input (G1) to receive a first input signal (IS1) being an input signal of the Doherty amplifier, and has an output (D1) to supply an amplified first input signal (OS1) at an output of the Doherty amplifier A second transistor (T2) forms a main amplifier stage of the Doherty amplifier and has a control input (G2) to receive a second input signal (IS2) and has an output (D2) to supply an amplified second input signal (0S2). The first input signal (IS1) and the second input signal (IS2) have a 90° phase offset. A first bond wire (BW1) forms a first inductance (L1), and extends in a first direction, and is arranged between the input bond pad (IBP) and the control input (G1) of the first transistor (T1). A second bond wire (B W2) forms a second inductance (L2), and extends in the first direction, and is arranged between the output bond pad (OBP) and the output (D1) of the first transistor (T1). A third bond wire (B W3) forms a third inductance (L3) and extends in a second direction substantially perpendicular to the first direction, and is arranged between the output (D1) of the first transistor (T1) and the output (D2) of the second transistor (T2).

13 Claims, 3 Drawing Sheets

U.S. PATENT DOCUMENTS

Figure 1:
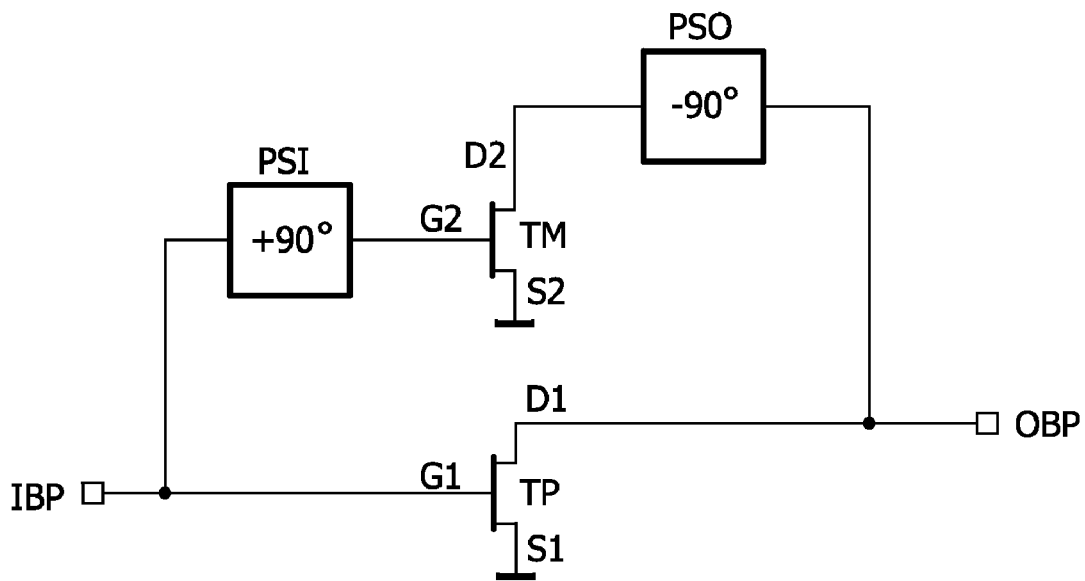

| | | | |
|---|---|---|---|
| 6,791,417 B2 * | 9/2004 | Pengelly et al. | 330/295 |
| 7,078,976 B2 * | 7/2006 | Blednov | 330/286 |
| 7,414,478 B2 * | 8/2008 | Elmala et al. | 330/295 |
| 7,489,910 B2 * | 2/2009 | Kato et al. | 455/101 |
| 2004/0085134 A1 | 5/2004 | Griffith et al. | |
| 2009/0295473 A1 * | 12/2009 | Dupuy et al. | 330/124 R |

OTHER PUBLICATIONS

Masaya Iwamoto et al; "An Extended Doherty Amplifier With High Efficiency Over a Wide Power Range". IEEE Transactions on Microwave Energy and Techniques, IEEE Service Center, Piscataway, NJ, US, vol. 49, No. 12. Dec. 2001, p. 2475.

* cited by examiner

DOHERTY AMPLIFIER

The invention relates to an integrated Doherty amplifier structure, and to a Doherty amplifier circuit.

The publication "A new high-efficiency power amplifier for modulated waves" by W. H. Doherty, in Bell Telephone System technical publications, presented at the annual convention of the institute of radio engineers, Cleveland, Ohio, May, 1936 discloses a linear power amplifier for amplifying a modulated high frequent carrier signal with a high efficiency. The high efficiency is obtained by using two tubes, which form a basic amplifier structure. In one embodiment, a first tube (called tube 2 in FIG. 9b of this publication) receives directly the input signal of the basic amplifier structure and has an output directly connected to the output of the basic amplifier structure. The second tube (called tube 1 in FIG. 9b of this publication) receives the input signal of the basic amplifier structure via a +90 degrees phase shift network and has an output connected via a −90 degrees phase shift network to the output of the basic amplifier structure.

The first tube is biased for operation in class C and does not conduct any current at low power level. The first tube starts conducting current at a power level, which is about 6 dB below maximum power level of the basic amplifier structure, so that at the peak of modulation the required additional power output is obtained from this tube. The second tube, which is biased for class AB operation behaves like a conventional linear amplifier from zero excitation until the carrier level. The first tube comes into play as the instantaneous excitation increases beyond the carrier level. That is why in modern literature the first tube (nowadays: first transistor) is referred to as the peak amplifier of the Doherty amplifier, and the second tube (nowadays: second transistor) is referred to as the carrier or main amplifier of the Doherty amplifier.

WO2004/017512 is a recent patent application disclosing a high power Doherty amplifier wherein artificial transmission lines are used for creating the 90-degree phase shifts. This patent application can be used as a reference for the terminology used.

Although Doherty amplifiers are a well-known technology for many years, it is still a struggle to efficiently implement such amplifiers in an integrated circuit. Especially, it appears to be difficult to obtain a high output power and a good performance on a small chip area.

The most general obstacles for the Doherty implementation are the required small size of the component, and semiconductor substrate losses. These issues prevent the integrated Doherty design to be suitable for mass production at low price. All known high power semiconductor Doherty Amplifiers use a more or less standard solution which comprises an input power divider with port isolation and unequal power division, distributed 90° transmission lines and output compensation lines. These elements require significant space on application boards. This situation is not matching the trend of communication equipment for integration and compact design. An additional problem is that the implementation of the distributed transmission lines is difficult in an integrated process due to the fact that semiconductor substrate, such as highly doped silicium, is in general a high loss material. A quarter-wavelength line may introduce up to 10 dB loss at 2 GHz and further consumes a very large space on the substrate surface.

It is an object of the invention to provide a Doherty amplifier structure in an integrated circuit, which has an improved performance and a small chip area.

A first aspect of the invention provides an integrated Doherty amplifier structure as claimed in claim 1. A second aspect of the invention provides a Doherty amplifier circuit as claimed in claim 10. Advantageous embodiments are defined in the dependent claims.

An integrated Doherty amplifier structure in accordance with the first aspect of the invention comprises an input bond pad at which an input signal of the Doherty amplifier is received, and an output bond pad at which the output signal of the Doherty amplifier is supplied. A first transistor forms the peak amplifier stage of the Doherty amplifier and has a control input to receive the input signal of the Doherty amplifier, and an output for supplying an amplified first input signal at the output of the Doherty amplifier. A second transistor forms the main amplifier stage of the Doherty amplifier and has a control input to receive a second input signal, and an output to supply an amplified second input signal. If the transistor is a FET, the control input is the gate and the output is the drain. If the transistor is a bipolar transistor, the control input is the base and the output is the collector. As required for a Doherty amplifier, the first input signal and the second input signal have a 90° phase shift.

A first bond wire, which extends in a first direction and which is arranged between the input bond pad and the control input of the first transistor, forms a first inductance. A second bond wire, which extends in the first direction, and which is arranged between the output bond pad and the output of the first transistor forms a second inductance.

A third bond wire which extends in a second direction substantially perpendicular to the first direction, and which is arranged between the output of the first transistor and the output of the second transistor forms a third inductance. These bond-wires form inductances which are part of phase shift circuits for creating the 90 degrees phase shift.

Due to the fact that the third bond wire extends substantially perpendicular to the first and the second bond wire, the coupling between the third bond wire on the one hand and the first and the second bond wire on the other hand is very small. This enables to position the bond wires near to each other without deteriorating the performance of the Doherty amplifier. Consequently a Doherty amplifier is possible with a good performance while only a small area is required for the integrated circuit.

In an embodiment as claimed in claim 2, the input bond pad and the output bond pad are positioned at opposite sides of the first and the second transistors. Or said differently, both the first and the second transistors are positioned in-between these bond pads. Consequently, the first and second bond wires are maximally spaced apart and thus have a minimal mutual coupling.

In an embodiment as claimed in claim 3, the first transistor comprises a first finger structure of interleaving first fingers and second fingers, both fingers extend in the second direction. The first fingers are interconnected to receive the first input signal, and the second fingers are interconnected to supply the amplified first input signal. The first fingers and the second fingers alternate in the first direction. Thus, for a transistor with a relatively large area, the fingers form a rectangle with short sides aligned with the second direction and long sides aligned with the first direction.

In an embodiment as claimed in claim 4, the second transistor comprises a second finger structure of interleaving first fingers and second fingers, both extending in the second direction. Again, the first fingers are interconnected to receive the second input signal, and the second fingers are interconnected to supply the amplified second input signal. Again, the first fingers and the second fingers alternate in the first direction.

In an embodiment as claimed in claim 5, the integrated Doherty amplifier structure further comprises an input capacitor arranged between the control inputs of the first and the second transistors.

In an embodiment as claimed in claim 6, the first transistor is a first field effect transistor with a gate, which receives the first input signal, and a drain which supplies the amplified first input signal. The second transistor is a second field effect transistor with a gate, which receives the second input signal, and a drain which supplies the amplified second input signal. The Doherty amplifier comprises in the order mentioned, when moving along a line extending in the second direction: the second drain, the second finger structure, the second gate, the input capacitor, the first gate, the first finger structure, and the first drain. The first gate and the second gate are interconnected via the input capacitor. This topology of the Doherty amplifier is particularly compact. It is a further advantage, that the power capability of the integrated circuit can easily be increased by positioning a plurality of these basic Doherty amplifier structures next to each other in the second direction, such that a column of basic Doherty amplifiers is obtained.

In an embodiment as claimed in claim 7, a center of gravity of a first area covered by the first finger structure and a center of gravity of a second area covered by the second finger structure are positioned on a straight line extending in the second direction. This provides a symmetrical topology of the finger structures, which are the basic parts of the transistors, with respect to the second direction. This has the advantage that the distance of the bond pads with respect to the first and the second transistor are identical and thereby also the signal delays are identical.

In an embodiment as claimed in claim 8, a series arrangement of a second capacitor and a fourth inductor is connected to the control input of the first transistor. This series arrangement provides an easy tool to tune the input impedance seen at the first transistor to a desired reactive value and to lower the quality factor to a desired value. The lower quality factor provides a wider frequency bandwidth.

In an embodiment as claimed in claim 9, a series arrangement of a third capacitor an a fifth inductor is connected to the control input of the second transistor. This series arrangement provides an easy tool to select the input impedance seen at the second transistor to have a required reactive value and quality factor.

In an embodiment as claimed in claim 11, the Doherty amplifier circuit as claimed in claim 10 further comprises a capacitor arranged in series with the third inductor. Preferably, this capacitor is arranged close to the drain bond pad of one of the transistors. The optional capacitor provides more flexibility in providing a required value of reactance.

These and other aspects of the invention are apparent from and will be elucidated with reference to the embodiments described hereinafter.

Figure 2A:
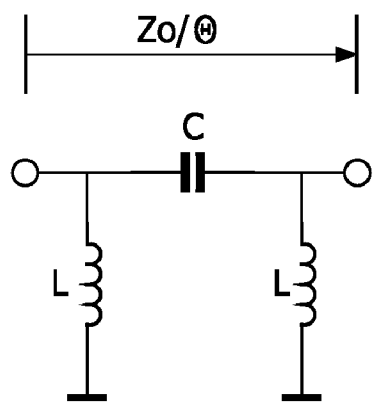
Figure 2B:
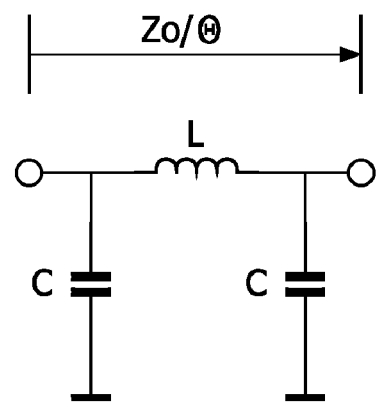
Figure 3:
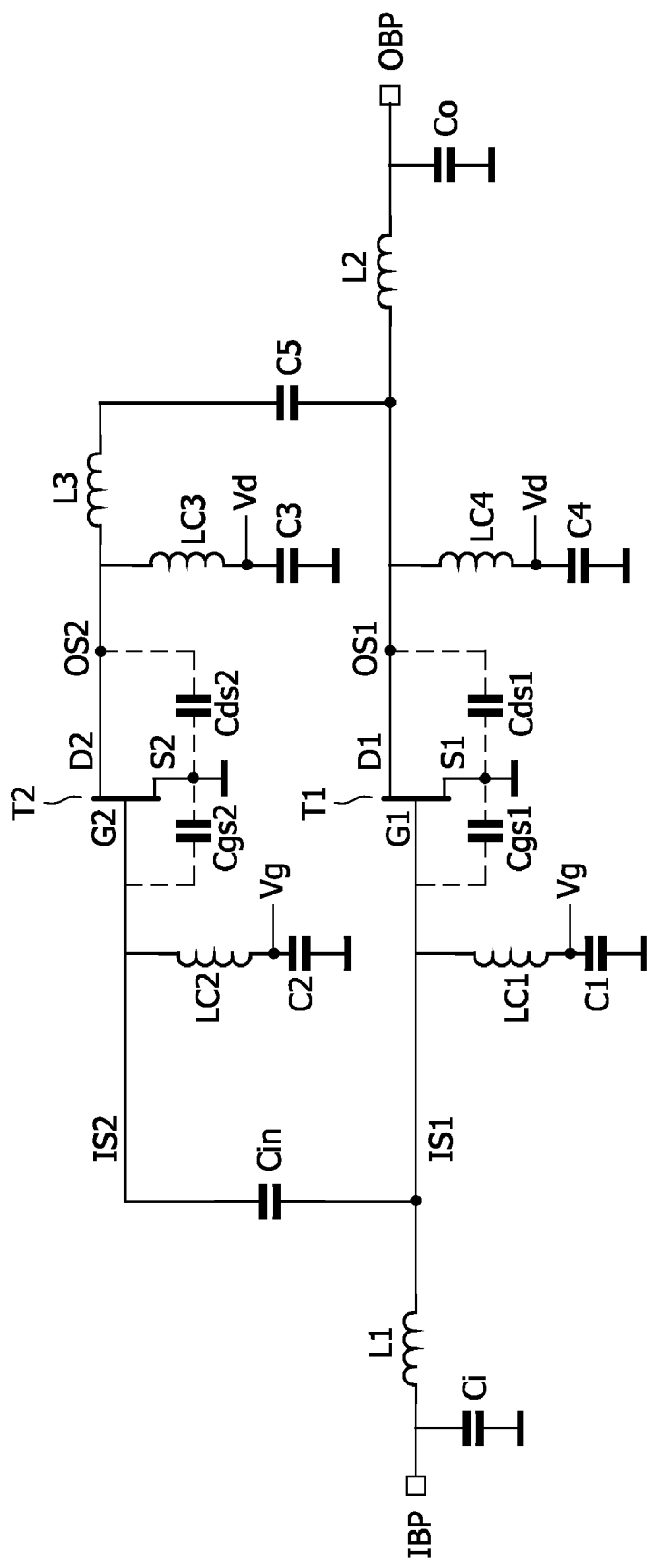
Figure 4:
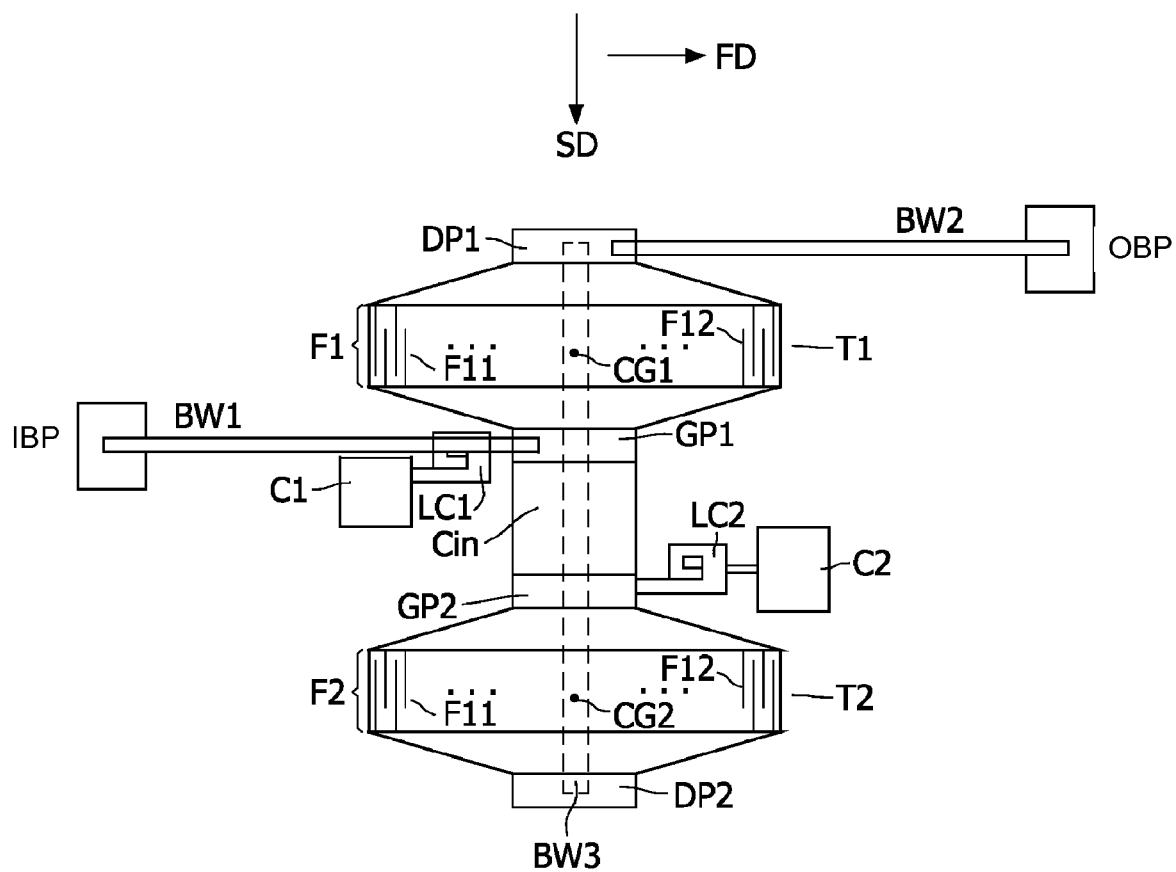

In the drawings:

FIG. 1 shows schematically a basic circuit diagram of a prior art Doherty amplifier, FIGS. 2A and 2B show a circuit diagram of two different lumped element phase shift circuits in a high-pass and low-pass configuration, respectively, FIG. 3 shows a detailed circuit diagram of a Doherty amplifier in accordance with an embodiment of the present invention, and FIG. 4 shows a structure of the Doherty amplifier as an integrated circuit in accordance with an embodiment of the present invention.

It should be noted that items, which have the same reference numbers in different Figures, have the same structural features and the same functions, or are the same signals. Where the function and/or structure of such an item has been explained, there is no necessity for repeated explanation thereof in the detailed description.

FIG. 1 shows schematically a basic circuit diagram of a prior art Doherty amplifier. The main amplifier is represented by the transistor TM, and the peak amplifier is represented by the peak transistor TP. The peak transistor TP has a control input G1, which is connected to the input IBP of the Doherty amplifier, and an output D1 which is connected to the output OBP of the Doherty amplifier. The main transistor TM has a control input G2 which is connected to the input IBP via a +90 degree phase shift circuit PSI, and an output D2 which is connected to the output OBP via a −90 degree phase shift circuit PSO.

By way of example, the peak transistor TP and the main transistor TM are shown to be FETs of which the control inputs G1, G2 are gates and the outputs D1, D2 are drains. The sources S1, S2 are connected to a reference voltage, which in this example is ground. The operation of the Doherty amplifier is not discussed in detail because it is well known from the already referred to publication of W. H. Doherty.

FIGS. 2A and 2B show a circuit diagram of two different lumped element phase shift circuits. Both circuits have a characteristic impedance Zo and generate a phase shift θ=+/−90°. In a Doherty implementation, usually the characteristic impedances of the phase shift circuits differ. The phase shift circuit shown in FIG. 2A provides a phase shift of θ=90°, and comprises a capacitor C arranged between the input and the output of the phase shift circuit, a first inductor L connected between the input and ground, and a second inductor L connected between the output and ground. The phase shift circuit shown in FIG. 2B provides a phase shift of θ=−90° and has a series inductor L arranged between the input and the output, and two capacitors C, one connected between the input and ground and one connected between the output and ground.

At known frequency fo and impedances Zo for both the input and output phase shift circuit, the capacitor values C and the inductor values L are defined as $$C = \frac{1}{\omega Zo} \quad L = \frac{Zo}{\omega} \quad \text{wherein } \omega = 2\pi fo$$

FIG. 3 shows a detailed circuit diagram of a Doherty amplifier in accordance with an embodiment of the present invention. In the design of this Doherty amplifier, the parasitic gate source capacitances Cgs1, Cgs2 and the parasitic drain source capacitances Cds1, Cds2 of the FETs are incorporated in the input and output phase shifting circuits to provide the desired positive and negative 90° phase shifts respectively.

For those skilled in RF design, it is a very well known fact that a parallel connection of an inductor and a capacitor has a resonance at a particular frequency. Below the resonance frequency, the reactive part of the impedance of the parallel connection has a positive value and thus an inductive component, while above the resonance frequency the reactive part of the impedance has a negative and thus a capacitive component. When considering the parasitic capacitances of the main transistor T2 and the peak transistor T1 mentioned above, it should be clear that the parallel connection of the inductances LC1 to LC4 to each of them may create a required inductive or capacitive response on the desired frequency depending on the value of the specific inductance. In such a way a phase shift circuit may be created with a desired phase shift at a desired frequency. Also, for those experienced in RF design should be clear, that at the same time the real component of the input/output impedance of the device will be increased thereby providing a wider frequency response and a more constant impedance. The parallel inductances LC1 to LC4 may be realized by a bond wire or an integrated inductance on the top of semiconductor substrate. These inductances may be isolated for DC current from ground by the capacitors C1 to C4 providing a low impedance for the RF carrier signal. The junctions between the parallel inductances LC1 to LC4 and the capacitors C1 to C4, respectively, are the best connection points for providing a gate bias voltage or a drain power supply voltage with wide video-band/base-band frequency range suppression.

The input of the Doherty amplifier is provided in the form of the input bond pad IBP, and the output of the Doherty amplifier is provided in the form of the output bond pad OBP. An optional capacitor Ci is connected between the input bond pad IBP and ground, and an optional capacitor Co is connected between the output bond pad OBP and ground. The peak transistor T1 has a gate G1, which is connected to the input bond pad IBP via an optional inductor L1, a drain D1 which is connected to the output bond pad OBP via an optional inductor L2, and a source S1 which is connected to ground. The main transistor T2 has a gate G2, which is connected to the gate G1 of the peak transistor T1 via a capacitor Cin, a drain D2 which is connected to the drain D1 of the peak transistor T1 via an inductor L3, and a source S2 which is connected to ground. Optionally, a capacitor C5 may be arranged in series with the inductor L3.

The capacitor Ci and the inductor L1 form an additional impedance transformer of a low pass filter configuration at the input. The capacitor Co and the inductor L2 form a low pass filter impedance transformer at the output.

An optional series arrangement of a capacitor C1 and an inductor Lc1 is connected between the gate G1 and ground. The optional capacitor C1 is a DC decoupling capacitor with an impedance at the carrier frequency, which is negligible with respect to the impedance of the inductor Lc1. The presence of this capacitor C1 has the advantage that the DC gate voltage Vg can be applied to the gate G1 via a low pass filter. The inductor Lc1 value is selected such that together with the parallel arranged gate-source capacitor Cgs1 a desired positive reactance is obtained at the frequency of operation. Or said in other words, to obtain an inductive input impedance of the transistor T1.

An optional series arrangement of a capacitor C2 and an inductor Lc2 is connected between the gate G2 and ground. The optional capacitor C2 is DC decoupling capacitor, with an impedance at the carrier frequency, which is negligible with respect to the impedance of the inductor Lc2. The presence of this capacitor C2 has the advantage that the DC gate voltage Vg can be applied to the gate G2 via a low pass filter. The inductor Lc2 partially compensates for the gate-source capacitor Cgs2. The value of the inductor Lc2 can be selected to obtain an inductive input impedance of the transistor T2 at the operation frequency.

The combination of these inductive input impedances of the transistors T1 and T2 combined with the capacitor Cin form a high-pass phase shifter configuration as shown in FIG. 2A. If the conditions expressed in the earlier mentioned equations are satisfied, a positive 90° phase shift is provided from the input of transistor T1 to the input of transistor T2.

An optional series arrangement of a capacitor C3 and an inductor Lc3 is connected between the drain D2 and ground. The optional capacitor C3 is DC decoupling capacitor with an impedance at the carrier frequency, which is negligible with respect to the impedance of the inductor Lc3. The presence of this capacitor C3 has the advantage that the DC drain voltage Vd can be applied to the drain D2 via a low pass filter. The inductor Lc3, which effectively is arranged in parallel with the drain-source capacitor Cds2, as explained earlier, is used for tuning the output impedance of the transistor T2 to a desired value. The value of the inductor Lc3 can be selected to obtain a reactive (capacitive) or inductive output impedance of the transistor T2. The inductor Lc3 can be implemented by a bond wire or by an integrated inductance deposited on the substrate of the chip.

An optional series arrangement of a capacitor C4 and an inductor Lc4 is connected between the drain D1 and ground. The optional capacitor C4 is a DC decoupling capacitor with an impedance at the carrier frequency, which is negligible with respect to the impedance of the inductor Lc4. The operation is identical to that of the capacitor C3 and the inductor Lc3 discussed with respect to the transistor T2.

The +90 degrees phase shift is obtained by the phase shift circuit PSI which comprises the capacitor Cin and the inductors LC1 and LC2 corresponding to the circuit shown in FIG. 2A. The −90 degrees phase shift is obtained by the phase shift circuit PSO which comprises the inductor L3 and the capacitors Cds1 and Cds2 and forms the circuit shown in FIG. 2B.

FIG. 4 shows a layout and structure of the Doherty amplifier in an integrated circuit in accordance with an embodiment of the present invention. In this embodiment, the components LC3, C3, LC4, C4 of FIG. 3 are not shown. This situation corresponds to the real LDMOST where the capacitors Cds2, Cds1 have values providing a desired negative/capacitive reactance at 2 GHz to build the impedance inverter shown in the FIG. 2B configuration. The topology of the basic building block of a Doherty amplifier comprises the peak transistor T1, the main transistor T2, a capacitor Cin, the inductor L3, which is the bond wire BW3, and the compensating series arrangements Lc1, C1 and Lc2, C2. Items, which extend in a direction substantially parallel to the arrow indicated by FD extend in the first direction FD, and items, which extend substantially in parallel to the arrow indicated by SD extend in the second direction SD. The arrows FD an SD are substantially perpendicular with respect to each other.

The peak transistor T1 comprises a finger structure F1 of gate fingers F11 and drain fingers F12, which both extend in the second direction SD and alternate in the first direction FD. The gate fingers F11 are interconnected to a gate pad indicated by GP1. The drain fingers F12 are interconnected to a drain pad indicated by DP1. Usually, the finger structure F1 is positioned in-between the gate pad GP1 and the drain pad DP1. Preferably, the layout of the peak transistor T1 is symmetrical in that the gate pad GP1, the drain pad DP1, and the finger structure F1 are mirror symmetrical around a same line which extends in the second direction SD. Optionally, an equal distance exists between both the gate pad GP1 and the drain pad DP1 on the one hand and a center of gravity CG1 of the finger structure F1 on the other hand.

The main transistor T2 comprises a finger structure F2 of gate fingers F21 and drain fingers F22, which both extend in the second direction SD and alternate in the first direction FD. The gate fingers F21 are interconnected to a gate pad indicated by GP2. The drain fingers F22 are interconnected to a drain pad indicated by DP2. Usually, the finger structure F2 is positioned in-between the gate pad GP2 and the drain pad DP2. Preferably, the layout of the peak transistor T2 is symmetrical in that the gate pad GP2, the drain pad DP2, and the finger structure F2 are mirror symmetrical around a same line which extends in the second direction SD. Optionally, an equal distance exists between both the gate pad GP2 and the drain pad DP2 on the one hand and a center of gravity CG2 of the finger structure F2 on the other hand.

The 90 degrees phase shift of the signals at the inputs of the transistors is obtained by the capacitor Cin together with inductive input impedances of the transistors T1 and T2 tuned by the inductors LC1 and LC2. The capacitor Cin is positioned on the chip in-between the gate pads GP1 and GP2. Preferably, the surface occupied by this capacitor Cin is not much larger than the area occupied by each one of the gate pads GP1, GP2. This leaves space for the series arrangements Lc1, C1 and Lc2, C2. The series arrangement Lc1, C1 comprises the capacitor C1 and the inductor Lc1, and the series arrangement Lc2, C2 comprises the capacitor C2 and the inductor Lc2.

The gate pad GP1 is connected to the input bond pad IBP of the integrated circuit via the bond wire BW1 which extends in the first direction FD and which forms the inductor L1. The drain pad DP1 is connected to the output bond pad OBP of the integrated circuit via the bond wire BW2 which also extends in the first direction FD and which forms the inductor L2. Although the bond wires BW1 and BW2 extend in the same direction, their mutual electromagnetic coupling is minimal because there is only a minimal area where they run in parallel. The drain pads DP1 and DP2 are connected by a bond wire BW3 which extends in the second direction SD and which forms the inductor L3. Because the bond wire BW3 extents substantially perpendicular to the bond wires BW1 and BW2, their mutual electromagnetic coupling is minimal. The length of the bond wires BW1, BW2 and BW3 is adjustable by selecting a suitable height above the chip surface within a free space between the package of the chip and the chip surface. Thus, it is very easy to trim the performance of the Doherty amplifier by selecting the optimal lengths of these bond wires BW1, BW2 and BW3.

It has to be noted that the building block shown is very compact, and that it easily possible to add a building block in parallel to the building block shown if a higher output power of the Doherty amplifier is required. With parallel is meant that the further building block is added displaced in the second direction SD. Preferably, the further building block is identical to the building block shown. Further, preferably, the bond wires BW3 which connect the drains of the transistors T1, T2 within each one of the building blocks are positioned on the same line for all the building blocks.

The Doherty amplifier can be implemented in RF amplifiers for wireless communication, such as, for example, 3G wireless communication, W-CDMA or any other RF power amplifier application wherein high efficiency is important.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. An integrated Doherty amplifier structure comprising:
an input bond pad (IBP) on an integrated circuit,
an output bond pad (OBP) on the integrated circuit,
a first transistor on the integrated circuit, the first transistor forming a peak amplifier stage of the Doherty amplifier and having a control input for receiving a first input signal being an input signal of the Doherty amplifier, and having an output for supplying an amplified first input signal at an output of the Doherty amplifier,
a second transistor on the integrated circuit, the second transistor forming a main amplifier stage of the Doherty amplifier and having a control input or receiving a second input signal and having an output for supplying an amplified second input signal, wherein a phase of the first input signal is lagging 90 degrees behind a phase of the second input signal,
a first bond wire on the integrated circuit, the first bond wire forming a first inductance and predominantly extending in a first direction, and being arranged between the input bond pad and the control input of the first transistor,
a second bond wire on the integrated circuit, the second bond wire forming a second inductance and predominantly extending in the first direction, and being arranged between the output bond pad and the output of the first transistor, and
a third bond wire on the integrated circuit, the third bond wire forming a third inductance, predominantly extending in a second direction substantially perpendicular to the first direction, and being arranged between the output of the first transistor and the output of the second transistor.

2. An integrated Doherty amplifier structure as claimed in claim 1, wherein the input bond pad and the output bond pad are positioned at opposite sides of the first and the second transistors.

3. An integrated Doherty amplifier structure as claimed in claim 1, wherein the first transistor comprises a first finger structure of interleaving first fingers and second fingers, wherein the first fingers are interconnected to receive the first input signal, and the second fingers supply the amplified first input signal, and wherein both the first fingers and the second fingers extend in the second direction while the first fingers and the second fingers alternate in the first direction.

4. An integrated Doherty amplifier structure as claimed in any one of the preceding claims, wherein the second transistor comprises a second finger structure of interleaving first fingers and second fingers, wherein its first fingers are interconnected to receive the second input signal, and its second fingers supply the amplified second input signal, and wherein both its first fingers and its second fingers extend in the second direction while the first fingers and the second fingers alternate in the first direction.

5. An integrated Doherty amplifier structure as claimed in in in claim 3, further comprising an input capacitor arranged between the control input of the first transistor and the control input of the second transistor.

6. An integrated Doherty amplifier structure as claimed in claim 5, wherein:
the first transistor is a first field effect transistor having a first gate for receiving the first input signal, a first drain for supplying the amplified first input signal,
the second transistor is a second field effect transistor having a second gate for receiving the second input signal, a second drain for supplying the amplified second input signal, and wherein the Doherty amplifier comprises in the order mentioned, along a line extending in the second direction: the second drain, the second finger structure, the second gate, the input capacitor, the first gate, the first finger structure, and the first drain, and wherein the first gate and the second gate are interconnected via the input capacitor.

7. An integrated Doherty amplifier structure as claimed in claim 3, wherein a center of gravity of a first area covered by the first finger structure and a center of gravity of a second area covered by the second finger structure are positioned on a straight line extending in the second direction.

8. An integrated Doherty amplifier structure as claimed in claim 5, wherein a series arrangement of a second capacitor and a fourth inductor is connected to the control input of the first transistor.

9. An integrated Doherty amplifier structure as claimed in claim 5, wherein a series arrangement of a third capacitor and a fifth inductor is connected to the control input of the second transistor.

10. A Doherty amplifier circuit comprising:
an input bond pad (IBP) on an integrated circuit, wherein the input bond pad is arranged for receiving a first input signal,
an output bond pad (OBP) on the integrated circuit, wherein the output bond pad is arranged for supplying an output signal of the Doherty amplifier,
a first transistor on the integrated circuit, the first transistor forming a peak amplifier stage of the Doherty amplifier, and having a control input for receiving the first input signal being an input signal of the Doherty amplifier, and having an output for supplying an amplified first input signal at an output of the Doherty amplifier,
a second transistor on the integrated circuit, the second transistor forming a main amplifier stage of the Doherty amplifier and having a control input for receiving a second input signal and having an output for supplying an amplified second input signal, wherein a phase of the first input signal is lagging 90 degrees behind a phase of the second input signal,
an input capacitor on the integrated circuit, the input capacitor arranged between the control input of the first transistor and the control input of the second transistor,
a first series arrangement of an inductor and a capacitor on the integrated circuit, the first series arrangement arranged between the control input of the first transistor and a first reference level,
a second series arrangement of an inductor and a capacitor on the integrated circuit, the second series arrangement arranged between the control input of the second transistor and a second reference level,
an output inductance on the integrated circuit, the output inductance connected between the output of the second transistor and the output of the first transistor,
a first bond wire on the integrated circuit, the first bond wire forming a first inductance and predominantly extending in a first direction, and being arranged between the input bond pad and the control input of the first transistor,
a second bond wire on the integrated circuit, the second bond wire forming a second inductance and predominantly extending in the first direction, and being arranged between the output bond pad and the output of the first transistor, and
a third bond wire on the integrated circuit, the third bond wire forming a third inductance, extending in a second direction substantially perpendicular to the first direction, and being arranged between the output of the first transistor and the output of the second transistor.

11. A Doherty amplifier circuit as claimed in claim 10, further comprising a further capacitor arranged in series with the third inductor.

12. A Doherty amplifier circuit as claimed in claim 10, wherein the first transistor and the second transistor have a different size.

13. A Doherty amplifier circuit as claimed in claim 12, wherein the first transistor is larger than second transistor.

* * * * *